US007615814B2

(12) United States Patent
Noma et al.

(10) Patent No.: US 7,615,814 B2
(45) Date of Patent: Nov. 10, 2009

(54) FERROELECTRIC DEVICE HAVING A CONTACT FOR TAKING THE POTENTIAL OF A METAL FILM AND A PLURALITY OF CAPACITORS POSITIONED PERIODICALLY

(75) Inventors: Atsushi Noma, Osaka (JP); Toyoji Ito, Toyama (JP)

(73) Assignee: Panasonic Corporation, Osaka (JP)

( * ) Notice: Subject to any disclaimer, the term of this patent is extended or adjusted under 35 U.S.C. 154(b) by 108 days.

(21) Appl. No.: 11/702,536

(22) Filed: Feb. 6, 2007

(65) Prior Publication Data

US 2007/0284636 A1 Dec. 13, 2007

(30) Foreign Application Priority Data

Jun. 8, 2006 (JP) ............................ 2006-159570

(51) Int. Cl.
*H01L 27/115* (2006.01)

(52) U.S. Cl. ............................ 257/295; 257/E27.104; 257/296; 257/306; 257/303

(58) Field of Classification Search ................. 257/295, 257/306, 296, 303, E27.104

See application file for complete search history.

(56) References Cited

U.S. PATENT DOCUMENTS

2004/0094791 A1 * 5/2004 Ito et al. .................... 257/310

FOREIGN PATENT DOCUMENTS

JP 2005-268494 9/2005

* cited by examiner

*Primary Examiner*—Anh Phung
*Assistant Examiner*—Allison P Bernstein
(74) *Attorney, Agent, or Firm*—McDermott Will & Emery LLP

(57) ABSTRACT

A semiconductor memory device includes: a first conductive layer; a second conductive layer; a first insulating film; a first plug; a second plug; a second insulating film having a first opening and a second opening; a first metal film; a second metal film; a first capacitor insulating film formed on the first metal film; a second capacitor insulating film formed on the second metal film; and a third metal film. The second metal film is formed so that an end thereof located away from the first opening extends onto the top surface of the second insulating film. The second metal film is connected at its extending portion to the third metal film.

6 Claims, 7 Drawing Sheets

119 115 116 114 121 120 118 117 115 113 111 110 108 105 106 104 101 100 103 112 109 107 108 102 106 111 102

100
104
105
103
114
112
109
107
113
108
106
102
101
111
119
110
115
118
116
117
120
121

FERROELECTRIC DEVICE HAVING A CONTACT FOR TAKING THE POTENTIAL OF A METAL FILM AND A PLURALITY OF CAPACITORS POSITIONED PERIODICALLY

BACKGROUND OF THE INVENTION (a) Fields of the Invention

The present invention relates to semiconductor memory devices which include capacitor elements having capacitor insulating films made of a ferroelectric film, and to their fabrication methods.

(b) Description of Related Art

With recent progress in digital technologies, there is a growing trend to rapidly process or store a large capacity of information data. In accordance with this trend, research and development is actively conducted on ferroelectric memory devices employing ferroelectric capacitors with spontaneous polarization properties as capacitor elements constituting the semiconductor memory device.

In order to offer a more improved packing density of the device and resulting increase in the capacity thereof, ferroelectric memory devices including three-dimensional capacitor elements (referred hereinafter to as 3D capacitor elements) are actively developed. In this three-dimensional capacitor element, by three-dimensionally forming the capacitor element over a stepped opening, not only a flat portion but also a side wall portion of the formed element is used for a capacitor. Such a three-dimensionally stacked structure (referred hereinafter to as a 3D stacked structure) is employed to secure, even in a small area, the absolute capacitance necessary for memory operations, so that the cell size can be significantly reduced to attain increases in packing density and capacity.

For the 3D stacked capacitor element as shown above, a contact structure for taking the potential of an upper electrode or a lower electrode of the capacitor element is proposed. In this contact structure proposed, a contact with the upper electrode is connected not from an upper-layer side but from a lower-layer side, specifically, from a conductive layer formed on a semiconductor substrate. However, since in the 3D stacked capacitor element, the relative position of the upper electrode from the substrate becomes high because of its construction, formation of a contact with high aspect ratio is required. For a ferroelectric memory device employing such a capacitor element of a 3D stacked structure, an upper-electrode connection structure in consideration of the yield of such a contact with high aspect ratio (see, for example, Japanese Unexamined Patent Publication No. 2005-268494) is proposed.

Hereinafter, a semiconductor memory device according to the conventional technique mentioned above will be described with reference to the accompanying drawings.

FIG. 7 is a sectional view showing the structure of the conventional semiconductor memory device including a capacitor element of a 3D stacked structure.

Referring to FIG. 7, in a semiconductor substrate 10, a first doped layer 12 and a second doped layer 13 are formed apart from each other with an isolation region 11 interposed therebetween. A first insulating film 14 is formed on the entire surface of the semiconductor substrate 10, and a first hydrogen barrier film 15 is formed on the first insulating film 14. In the first insulating film 14, openings are provided at predetermined positions, respectively, and a first contact plug 16 electrically connected to the first doped layer 12 and a second contact plug 17 electrically connected to the second doped layer 13 are formed in the respective openings.

On the first hydrogen barrier film 15, a first laminated conductive barrier film 18 and a second laminated conductive barrier film 19 having a similar structure to the first laminated conductive barrier film 18 are formed to cover the first contact plug 16 and the second contact plug 17, respectively. A second insulating film 20 covering the first laminated conductive barrier film 18 and the second laminated conductive barrier film 19 is formed with a first opening 21 exposing the top surface of the first laminated conductive barrier film 18 and a second opening 22 exposing the top surface of the second laminated conductive barrier film 19.

The inside of the first opening 21 is formed with a capacitor element composed of a lower electrode 23, a capacitor insulating film 24 made of a ferroelectric film, and an upper electrode 25. The upper electrode 25 is also formed within the second opening 22.

On the upper electrode 25, a third insulating film 26 is formed to expand over the entire surface, and a second hydrogen barrier film 27 is formed on the third insulating film 26. A fourth insulating film 28 is formed on the second hydrogen barrier film 27.

As shown above, the potential of the upper electrode 25 of the capacitor element is indirectly connected to the second doped layer 13 through the second contact plug 17 and the second laminated conductive barrier film 19. Therefore, this structure can relieve the difficulty in forming the contact in the state of high aspect ratio.

SUMMARY OF THE INVENTION

The conventional semiconductor memory device mentioned above, however, has the following problems.

In general, as the material for an upper electrode or a lower electrode of a capacitor element using a ferroelectric film, use is made of a noble metal material, typified by Pt, Ir, Ru, or the like, thermally and chemically stable toward a ferroelectric film. However, since these noble metal materials generally have the property of poor adhesion to an insulating film made of $SiO_2$, the upper electrode 25 formed on the side wall of the second opening 22, that is, on the second insulating film 20 exfoliates from the side wall of the second opening 22. This disadvantageously degrades the yield of formation of a contact for taking the potential of the upper electrode 25.

Moreover, the lower electrode and the capacitor insulating film are formed within the first opening 21 to be provided with the 3D capacitor element. Thus, in forming the upper electrode 25, since the second opening 22 and the first opening 21 differ in step coverage, the upper electrode 25 provided in the second opening 22 with a greater depth than the first opening 21 tends to be formed to have a locally small thickness. This locally thin portion is easy to break. This also degrades the contact yield.

In view of the foregoing, an object of the present invention is to provide a semiconductor memory device as a ferroelectric memory device including a 3D capacitor element with a ferroelectric film, which can be formed, with good yield, with a contact structure for taking the potential of an upper electrode and which has excellent properties by preventing deterioration in properties of the capacitor element, and to provide a method for fabricating such a device.

To attain the above object, a semiconductor memory device according to one aspect of the present invention includes: a first conductive layer and a second conductive layer formed apart from each other in a semiconductor substrate; a first insulating film formed on the semiconductor substrate, the first conductive layer, and the second conductive layer; a first plug penetrating the first insulating film and connected at its bottom end to the first conductive layer; a second plug penetrating the first insulating film and connected at its bottom end to the second conductive layer; a second insulating film formed over the first insulating film and having at least a first opening and a second opening, the first opening being located above the first plug, the second opening being located above the second plug; a first metal-film formed on at least the bottom and side wall of the first opening and electrically connected to the first plug; a second metal film formed on at least the bottom and side wall of the second opening and electrically connected to the second plug; a first capacitor insulating film made of a ferroelectric film formed on at least the first metal film; a second capacitor insulating film made of a ferroelectric film formed on at least the second metal film; and a third metal film formed to extend onto the tops of the first and second capacitor insulating films and across an area between the first and second openings. In this method, the second metal film is formed so that an end thereof located away from the first opening extends onto the top surface of the second insulating film, and the second metal film is connected at its extending portion to the third metal film.

With the semiconductor memory device according to one aspect of the present invention, in the capacitor element composed of the first metal film, the first capacitor insulating film, and the third metal film, out of a contact path for taking the potential of the upper electrode formed of the third metal film, a contact portion made by the single-layer upper electrode is formed outside the second opening provided in the second insulating film with poor adhesion to the upper electrode. This prevents exfoliation of or a break in the upper electrode. Moreover, since this contact portion is formed on the top surface of the second insulating film, the upper electrode formed of the third metal film adheres flatly to the second metal film. This provides a stable contact. Therefore, in the semiconductor memory device including the 3D capacitor element, a contact structure for taking the potential of the upper electrode can be formed with extremely good yield, and thereby the semiconductor memory device including the capacitor element with excellent element properties can be provided.

Furthermore, the structure composed of the second metal film, the second capacitor insulating film, and the third metal film which are formed to cover the bottom and side wall of the second opening has substantially the same construction as the structure of the capacitor element formed to cover the bottom and side wall of the first opening. Thus, a regular pattern periodicity is maintained in processing the capacitor element located in the outmost portion of the cell plate formed of the upper electrode, which prevents deterioration in the properties of the capacitor element located in the outmost portion of the cell plate.

Preferably, in the semiconductor memory device according to one aspect of the present invention, the second capacitor insulating film is formed so that an end thereof located away from the first opening extends onto the top surface of the second insulating film and the second capacitor insulating film has a third opening exposing the extending portion of the second metal film, and the second metal film and the third metal film are connected to each other in the third opening.

With this device, out of the contact path for taking the potential of the upper electrode formed of the third metal film, a contact portion made by the single-layer upper electrode is formed in the third opening which is located inside the capacitor insulating film with good adhesion to the upper electrode and which has almost no difference in height. This effectively prevents exfoliation of or a break in the upper electrode.

Preferably, in the semiconductor memory device according to one aspect of the present invention, a plurality of first structures each including the first conductive layer, the first plug, the first opening, the first metal film, and the first capacitor insulating film are formed to be arranged at regular intervals in an area located opposite to a second structure including the second conductive layer, the second plug, the second opening, the second metal film, and the second capacitor insulating film, the distance between the second opening and a first opening of the plurality of first openings which is located in one end of a region formed with the plurality of first openings is identical to the distances between the plurality of first openings, the one end adjoining the second opening, and the first openings and the second opening have the same diameter.

With this device, a regular pattern periodicity is maintained in processing the capacitor element located in the outmost portion of the cell plate formed of the upper electrode, which more certainly prevents deterioration in the properties of the capacitor element located in the outmost portion of the cell plate.

Preferably, the semiconductor memory device according to one aspect of the present invention further includes an oxygen barrier film between the first plug and the first metal film and between the second plug and the second metal film.

With this device, oxidation of the first and second plugs can be prevented during a thermal treatment in an oxygen atmosphere necessary for crystallization of the first capacitor insulating film formed of the ferroelectric film. Therefore, the contact structure for taking the potential of the upper electrode can be formed with better yield.

Preferably, in the semiconductor memory device according to one aspect of the present invention, the first metal film, the first capacitor insulating film, and a portion of the third metal film covering the inside of the first opening are covered with a hydrogen barrier film.

With this device, the properties of the capacitor element composed of the first metal film, the first capacitor insulating film, and a portion of the third metal film covering the inside of the first opening can be prevented from deteriorating due to hydrogen produced during fabrication processes.

Preferably, in the semiconductor memory device according to one aspect of the present invention, the second structure is also formed next to a first structure of the plurality of first structures located in the other end of the region formed with the first structures.

With this device, the resistance component of the upper electrodes connected to one structure for taking the potential of the upper electrode can be reduced. Therefore, in driving the potential of a common cell plate formed of the upper electrodes, a delay in the driving speed generated by the resistance component of the upper electrodes can be effectively prevented to provide a semiconductor memory device capable of operating more rapidly.

In the semiconductor memory device according to one aspect of the present invention, the first capacitor insulating film and the second capacitor insulating film are connected to each other between the first opening and the second opening.

A method for fabricating a semiconductor memory device according to one aspect of the present invention is characterized in that the method includes: the step (a) of forming a first conductive layer and a second conductive layer on a semiconductor substrate to be spaced apart from each other; the step (b) of forming a first insulating film on the semiconductor substrate, the first conductive layer, and the second conductive layer; the step (c) of forming a first plug and a second plug in the first insulating film, the first plug penetrating the first insulating film and being connected at its bottom end to the first conductive layer, the second plug penetrating the first insulating film and being connected at its bottom end to the second conductive layer; the step (d) of forming a second insulating film over the first insulating film; the step (e) of forming a first opening and a second opening in the second insulating film, the first opening being located above the first plug, the second opening being located above the second plug; the step (f) of forming a first metal film on at least the bottom and side wall of the first opening and a second metal film on at least the bottom and side wall of the second opening, the first metal film being electrically connected to the first plug, the second metal film being electrically connected to the second plug so that an end thereof located away from the first opening extends onto the top surface of the second insulating film; the step (g) of forming a first capacitor insulating film made of a ferroelectric film on at least the first metal film, and a second capacitor insulating film made of a ferroelectric film on at least the second metal film; and the step (h) of forming a third metal film to extend onto the tops of the first and second capacitor insulating films and across an area between the first and second openings and to be connected to the second metal film at the extending portion of the second metal film.

With the method for fabricating a semiconductor memory device according to one aspect of the present invention, in the capacitor element composed of the first metal film, the first capacitor insulating film, and the third metal film, out of a contact path for taking the potential of the upper electrode formed of the third metal film, a contact portion made by the single-layer upper electrode is formed outside the second opening provided in the second insulating film with poor adhesion to the upper electrode. This effectively prevents exfoliation of or a break in the upper electrode. Therefore, in the semiconductor memory device including the 3D capacitor element, a contact structure for taking the potential of the upper electrode can be formed with extremely good yield, and thereby the semiconductor memory device including the capacitor element with excellent element properties can be provided.

Furthermore, the second opening or the second metal film is formed simultaneously with the formation of the first opening or the first metal film. Thus, a regular pattern periodicity is maintained in processing the capacitor element located in the outmost portion of the cell plate formed of the upper electrode, which prevents deterioration in the properties of the capacitor element located in the outmost portion of the cell plate.

Preferably, in the method for fabricating a semiconductor memory device according to one aspect of the present invention, in the step (g), the second capacitor insulating film is formed so that an end thereof located away from the first opening extends onto the top surface of the second insulating film, and then the step (g) includes a substep of forming, in the second capacitor insulating film, a third opening exposing the extending portion of the second metal film, and in the step (h), the third metal film is formed so that it extends through the third opening to make connection to the second metal film.

With this method, out of the contact path for taking the potential of the upper electrode formed of the third metal film, a contact portion made by the single-layer upper electrode is formed in the third opening which is located inside the capacitor insulating film with good adhesion to the upper electrode and which has almost no difference in height. This effectively prevents exfoliation of or a break in the upper electrode.

Preferably, the method for fabricating a semiconductor memory device according to one aspect of the present invention further includes, between the step (c) and the step (d), the step of forming a first oxygen barrier film covering the first plug and a second oxygen barrier film covering the second plug, and in the step (d), the second insulating film is formed over the first insulating film to cover the first and second oxygen barrier films.

With this method, oxidation of the first and second plugs can be prevented during a thermal treatment in an oxygen atmosphere necessary for crystallization of the first capacitor insulating film formed of the ferroelectric film. Therefore, the contact structure for taking the potential of the upper electrode can be formed with better yield.

Preferably, the method for fabricating a semiconductor memory device according to one aspect of the present invention further includes, between the step (b) and the step (c), the step of forming a lower hydrogen barrier film on the first insulating film, and after the step (h), the step of forming an upper hydrogen barrier film over the third metal film.

With this method, the properties of the capacitor element composed of the first metal film, the first capacitor insulating film, and a portion of the third metal film covering the inside of the first opening can be prevented from deteriorating due to hydrogen produced during fabrication processes.

In the semiconductor memory device and its fabrication method according to the present invention, the contact portion for taking the potential of the upper electrode of the capacitor to the outside is provided on the insulating film with the capacitor formed therein, whereby the contact portion can be formed with extremely good yield.

BEST MODE FOR CARRYING OUT THE INVENTION

A semiconductor memory device and its fabrication method according to one embodiment of the present invention will now be described with reference to the accompanying drawings.

Structure of Semiconductor Memory Device

Figure 1:
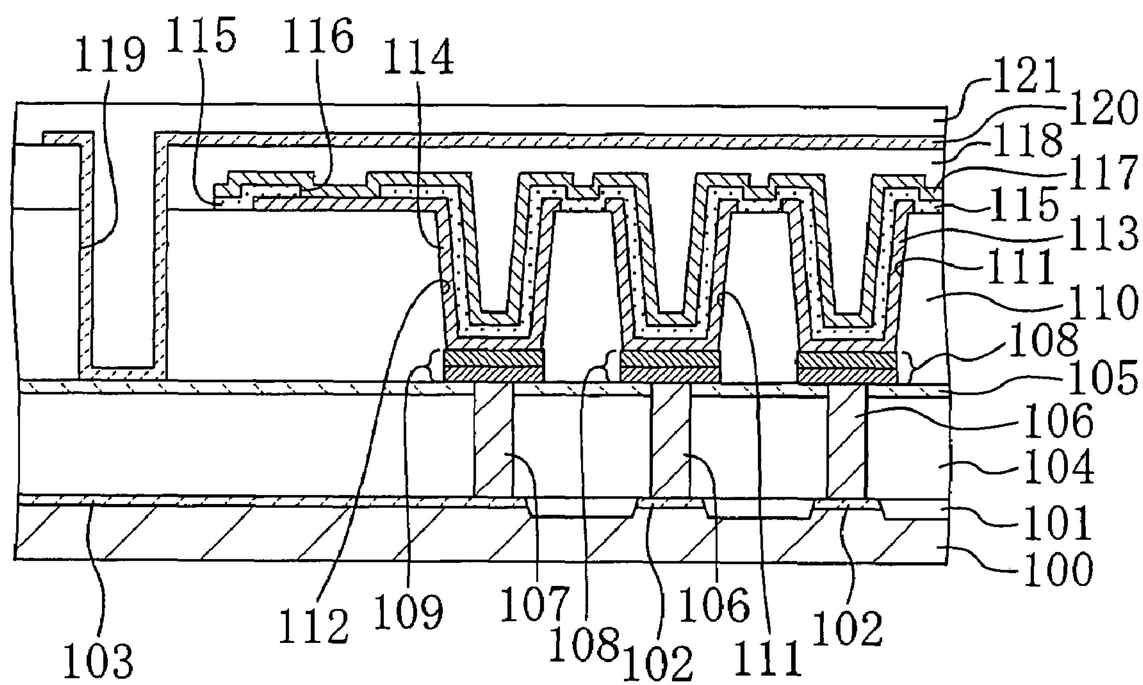
FIG. 1 is a sectional view showing the structure of a semiconductor memory device according to one embodiment of the present invention.

FIG. 1 is a sectional view showing the structure of the semiconductor memory device according to one embodiment of the present invention.

Referring to FIG. 1, an isolation region (Shallow Trench Isolation) 101 defining element formation regions is formed in a semiconductor substrate 100. A first doped layer (a first conductive layer) 102 and a second doped layer (a second conductive layer) 103 are formed in the associated element formation regions spaced by the isolation region 101. Note that metal silicide may be formed on the surfaces of the first and second doped layers 102 and 103. In this case, lowered resistance can prevent delay of circuit operations to provide a semiconductor memory device capable of operating more rapidly. In FIG. 1, description is made of the case where the second conductive layer is the second doped layer 103 formed in the semiconductor substrate 100. Instead of the second doped layer 103, as the second conductive layer, use may be made of, for example, an interconnect or the like of polysilicon or tungsten which is formed on the semiconductor substrate 100 to be contained in a first insulating film 104 that will be described later.

On the semiconductor substrate 100, for example, the first insulating film 104 of a silicon oxide film having a thickness of 500 to 800 nm is formed to cover the isolation region 101, the first doped layer 102, and the second doped layer 103. For example, a first hydrogen barrier film 105 of a silicon nitride film having a thickness of 20 to 100 nm is formed on the first insulating film 104. Although FIG. 1 shows the structure in which the first hydrogen barrier film 105 is formed, the first hydrogen barrier film 105 may not be formed in consideration of the necessity.

In the first insulating film 104 and the first hydrogen barrier film 105, openings are formed at predetermined locations to penetrate the first insulating film 104 and the first hydrogen barrier film 105, and a first contact plug 106 electrically connected to the first doped layer 102 and a second contact plug 107 electrically connected to the second doped layer 103 are formed in the associated openings. Note that the first and second contact plugs 106 and 107 are each made of, for example, tungsten or polysilicon. The first and second contact plugs 106 and 107 may have a barrier film made of, for example, TiN and Ta.

On the first hydrogen barrier film 105, a first laminated barrier film 108 is formed to cover the top surface of the first contact plug 106. The first laminated barrier film 108 is composed of: a conductive hydrogen barrier film of TiAlN or the like as a lower layer; and a conductive oxygen barrier film of $IrO_x$ or the like as an upper layer. Also, on the first hydrogen barrier film 105, a second laminated barrier film 109 having a similar structure to the first laminated barrier film 108 is formed to cover the top surface of the second contact plug 107. As shown above, by providing the first and second laminated barrier films 108 and 109, the effect of the oxygen barrier films present on the upper-layer sides of the first and second laminated barrier films 108 and 109 can prevent the first and second contact plugs 106 and 107 from being oxidized by a thermal treatment in an oxygen atmosphere for crystallization of a ferroelectric film 115 that will be described later. Moreover, combined with the effect of the first hydrogen barrier film 105, the effect of the hydrogen barrier films present on the lower-layer sides of the first and second laminated barrier films 108 and 109 can interrupt hydrogen diffusion from below the capacitor element to prevent deterioration in the properties of the capacitor element. Note that in the first and second laminated barrier films 108 and 109, the conductive oxygen barrier film located on the upper-layer side thereof may be formed to have a further laminated structure such as an $IrO_x$/Ir structure. If the crystallization temperature of the ferroelectric film 115 is adequately low, the conductive oxygen barrier film located on the upper-layer side thereof may not be formed. In consideration of the necessity, the conductive hydrogen barrier film located on the lower-layer side thereof may not be formed.

Over the entire surface of the first hydrogen barrier film 105, for example, a second insulating film 110 of a silicon oxide film having a thickness of 700 to 1000 nm is formed to cover the first laminated barrier film 108 and the second laminated barrier film 109. The second insulating film 110 is formed with a first opening 111 exposing the top surface of the first laminated barrier film 108 and a second opening 112 exposing the top surface of the second laminated barrier film 109.

In the first opening 111, for example, a first metal film 113 of platinum, iridium, or ruthenium is formed to cover the bottom and side wall thereof, while in the second opening 112, for example, a second metal film 114 of platinum, iridium, or ruthenium is formed so that it covers the bottom and side wall of the second opening 112 and its one end located away from the first opening 111 extends onto the top surface of the second insulating film 110. Although FIG. 1 shows the structure in which the both ends of the first metal film 113 and one end of the second metal film 114 located closer to the first opening 111 extend slightly onto the top surface of the second insulating film 110, these ends may be formed not to have such extensions.

On the first metal film 113 and the second metal film 114, for example, a SBT-, PZT-, or BLT-based ferroelectric film 115 is formed which has a thickness of 50 to 100 nm and serves as a capacitor insulating film (of the ferroelectric film 115, a portion formed inside the first opening 111 corresponds to a first capacitor insulating film, and a portion formed inside the second opening 112 corresponds to a second capacitor insulating film). In the ferroelectric film 115, a third opening 116 is formed in a portion thereof located on the extending portion of the second metal film 114 on the top surface of the second insulating film 110. FIG. 1 shows the structure in which the ferroelectric film 115 is formed continuously not only on the first metal film 113 and the second metal film 114 but also on the top surface portions of the second insulating film 110 existing between the first openings 111 and between the first and second openings 111 and 112. However, if it is formed only on at least the first metal film 113 and the second metal film 114, the ferroelectric film 115 may be formed separately between the first openings 111 and the first and second openings 111 and 112. Another approach may be employed in which the third opening 116 is not formed in the ferroelectric film 115 and the extending end of the second metal film 114 is electrically connected to a third metal film 117 that will be described later.

On the ferroelectric film 115 including the third opening 116, for example, the third metal film 117 made of platinum, iridium, or ruthenium is formed to continuously extend across areas between the first and second openings 111 and 112 and between the first openings 111. Thus, the third metal film 117 extends through the third opening 116 provided in the ferroelectric film 115 to make electrical connection to the second metal film 114 at a portion of the second metal film located on the top surface of the second insulating film 110.

For example, a third insulating film 118 having a thickness of 50 to 300 nm is formed over the entire surfaces of the second insulating film 110 and the third metal film 117. The third insulating film 118 is formed with a fourth opening 119 which penetrates the third insulating film 118 and the second insulating film 110 to expose the first hydrogen barrier film 105. On the side wall and bottom of the fourth opening 119 and on the third insulating film 118, for example, a second hydrogen barrier film 120 is formed which is made of a silicon nitride film and has a thickness of 20 to 100 nm. As shown above, by providing the second hydrogen barrier film 120, hydrogen diffusion from above the capacitor element can be interrupted to prevent deterioration in the properties of the capacitor element. Furthermore, the second hydrogen barrier film 120 is connected to the first hydrogen barrier film 105 at the end portion of the cell plate, whereby hydrogen diffusion from the side of the capacitor element can also be interrupted to completely prevent deterioration in the properties of the capacitor element.

For example, a fourth insulating film 121 having a thickness of 100 to 300 nm is formed on the second hydrogen barrier film 120 including the inside of the fourth opening 119. Although not shown, an interconnection layer is typically formed on the fourth insulating film 121.

As described above, in the semiconductor memory device according to one embodiment of the present invention, the stacked structure is formed which is composed of the first metal film 113, the ferroelectric film 115, and the third metal film 117 and covers the bottom and side wall of the first opening 111, and this structure functions as a 3D stacked capacitor element composed of a lower electrode (the first metal film 113), a capacitor insulating film (the ferroelectric film 115), and an upper electrode (the third metal film 117). In this structure, the upper electrode made of the third metal film 117 is formed to continuously extend across the area between the first openings 111. Thus, the multiple capacitor elements formed in the first openings 111, respectively, are provided to share the upper electrode as a common cell plate. Although not shown, a predetermined number of capacitor elements in the same shape are spaced at regular intervals in the right-hand side of FIG. 1. That is to say, a plurality of first structures is disposed which are each composed of: the first doped layer 102 (a first conductive layer); the first contact plug 106 (a first plug); the first opening 111; the first metal film 113; and at least the ferroelectric film 115 (a first capacitor insulating film) in the first opening 111, and the third metal film 117 covering the plurality of first structures is provided. In this manner, a memory cell region containing a predetermined number of capacitor elements spaced at regular intervals are constructed.

The upper electrode made of the third metal film 117 is also formed on the ferroelectric film 115 provided on the second metal film 114 to extend across the area between the first and second openings 111 and 112, and extends through the third opening 116 to make connection to the second metal film 114. The second metal film 114 extends from the top surface of the second insulating film 110 to the side wall of the second opening 112 to make connection to the second laminated barrier film 109 which is connected through the second contact plug 107 to the second doped layer 103.

Therefore, the second metal film 114 functions as part of a contact path for taking the potential of the upper electrode formed of the third metal film 117, and thereby the structure capable of taking the potential of the upper electrode formed of the third metal film 117 to the second doped layer 103 formed in the semiconductor substrate 100 is realized. Thus, a second structure composed of the second doped layer 103 (a second conductive layer), the second contact plug 107 (a second plug), the second opening (112), the second metal film 112, and at least a ferroelectric film in the second opening (a second capacitor insulating film) constitutes part of a contact path for taking the potential of the upper electrode formed of the third metal film 117.

In the construction shown above, out of the contact path for taking the potential of the upper electrode formed of the third metal film 117, a contact portion made by the single-layer upper electrode is formed in the third opening 116. Since the third opening 116 is formed not within the second insulating film 110 with a poor adhesion to the third metal film 117 but within the ferroelectric film 115, the adhesion of the third metal film 117 in the third opening 116 is extremely good. Moreover, since the third opening 116 is provided in an area where the second metal film 114 extends onto the top surface of the second insulating film 110, the depth of the third opening 116 is as small as about 100 nm or less which is a thickness of the ferroelectric film 115. Therefore, the difference in level is hardly caused in this area. This prevents, in the third opening 116, exfoliation of or a break in the upper electrode formed of the third metal film 117, so that the contact portion by the single-layer upper electrode can be formed with extremely high stability.

On the other hand, the second metal film 114 extends from the top surface of the second insulating film 110 to the side wall and bottom of the second opening 112 to make electrical connection to the second laminated barrier film 109. In this path, a stacked structure composed of the ferroelectric film 115 and the third metal film 117 is present on the second metal film 114. Thus, the effect of pressing the underlying layer by this stacked structure also prevents exfoliation of or a break in the second metal film 114.

As is apparent from the above, with the semiconductor memory device according to one embodiment of the present invention, the contact structure for taking the potential of the upper electrode formed of the third metal film 117 can be formed with extremely good yield. Moreover, since the potential of the upper electrode is taken to the second doped layer 103 in the semiconductor substrate 100, the structure in which the hydrogen barrier film fully covers the capacitor element is realized as in the case of the conventional technique. This completely avoids hydrogen-induced deterioration in the properties of the capacitor element.

In the semiconductor memory device according to one embodiment of the present invention, the second opening 112 is provided to adjoin the first opening 111, and the stacked structure composed of the second metal film 114, the ferroelectric film 115, and the third metal film 117 and formed to cover the bottom and side wall of the second opening 112 has substantially the same construction as the structure of the capacitor element composed of the first metal film 113, the ferroelectric film 115, and the third metal film 117 and formed to cover the bottom and side wall of the first opening 111.

With such a construction, in processing the first opening 111, the lower electrode formed of the first metal film 113, or the like, irregular pattern periodicity does not occur even in the capacitor element located in the outmost portion of the cell plate. That is to say, in processing the first opening 111, the first metal film 113, or the like constituting the capacitor element located in the outmost portion of the cell plate, this processing can be conducted in the state in which the same patterns also exist on the both sides, like the state in which the capacitor elements located in portions other than the outmost portion of the cell plate are formed. This prevents the capacitor element located in the outmost portion of the cell plate from being processed into a specific shape, so that deterioration in the properties of the capacitor element located in the outmost portion of the cell plate can be avoided.

Figure 7:
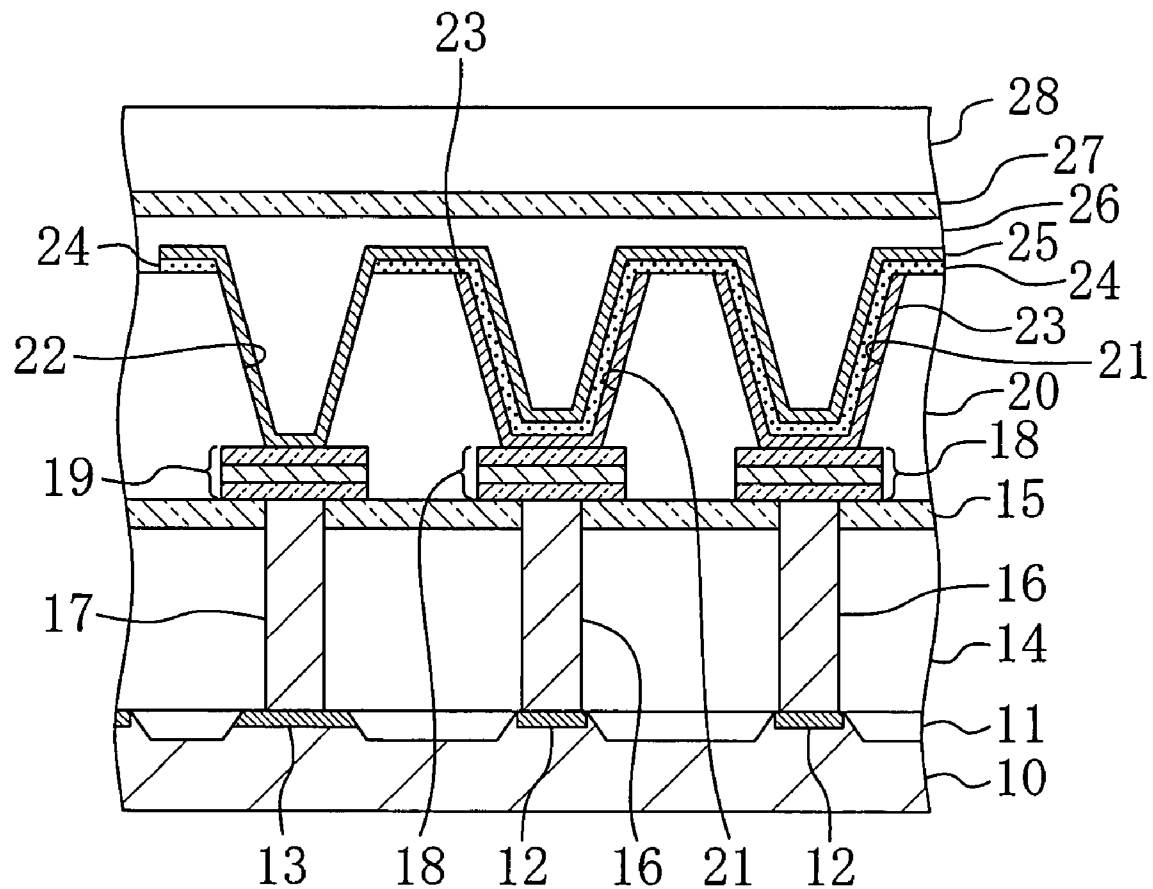
FIG. 7 is a sectional view showing the structure of a conventional semiconductor memory device.

In this regard, in the conventional semiconductor memory device described above (see FIG. 7), a plurality of capacitor elements composed of the lower electrode 23, the capacitor insulating film 24 of a ferroelectric film, and the upper electrode 25 which are formed in the first opening 21 are arranged as a memory cell array with the upper electrode 25 shared as a common cell plate. In such a case, however, the first opening 21 or the lower electrode 23 constituting the capacitor element located in the outmost portion of the cell plate tends to be processed into a specific shape as compared with the processed shapes of the first openings 21 or the lower electrodes 23 constituting the capacitor elements located in portions other than the outmost portion of the cell plate. This is because only the capacitor element located in the outmost portion of the cell plate has an irregular periodicity in processed pattern. Specifically, in forming patterns of the first openings 21, the lower electrodes 23, or the like constituting the capacitor elements located in portions other than the outmost portion of the cell plate, the first openings 21 are formed so that the openings with the same pattern are provided on the both sides of each opening, or the lower electrodes 23 are formed so that the lower electrodes with the same pattern are provided on the both sides of each electrode. However, in forming a pattern such as the first opening 21 or the lower electrode 23 constituting the capacitor element located in the outmost portion of the cell plate, the first opening 21 with the same pattern is present only on one side, or the lower electrodes 23 or the like on the both sides differ in the pattern shape. In this manner, the periodicity in processed pattern becomes irregular only at the outmost portion. Such a specific shape of the capacitor element located in the outmost portion of the cell plate will cause deterioration in the properties of the capacitor element in many cases. As concrete examples of such deterioration, in the capacitor element located in the outmost portion of the cell plate, the amount of accumulated charges decreases due to a decrease in the capacitor surface area resulting from a change in the taper angle of the first opening 21. Or, etching residues caused by a large amount of an etched target in the outmost portion are formed in the shape like a fence and adhere onto the side wall of the end of the lower electrode 23 of the first metal film 113 located closer to the second opening 22, which makes electrical continuity between the lower electrode 23 and the upper electrode 25 to degrade the insulation performance.

As is apparent from the above, the conventional semiconductor memory device has the problem that in the capacitor element located in the outmost portion of the cell plate, a specific patterned shape thereof causes deterioration in the properties of the capacitor element. However, the semiconductor memory device according to one embodiment of the present invention can solve this problem.

In the semiconductor memory device according to one embodiment of the present invention, preferably, the second opening 112 has a diameter identical to the diameter of the first opening 111, and the distance between the second opening 112 and the first opening 111 is identical to the distance between the first openings 111.

With this structure, the periodicity of the processed patterns is secured with higher precision, so that the occurrence of a specific processed shape located in the outmost portion of the cell plate can be prevented more certainly. As a result, deterioration in the properties of the capacitor element located in the outmost portion of the cell plate can be avoided more certainly.

Moreover, in the semiconductor memory device according to one embodiment of the present invention, preferably, the third opening 116 has a smaller diameter than the first opening 111. With this structure, an increased length of the cell plate produced by additionally providing the third opening 116 as part of the contact structure for taking the potential of the upper electrode formed of the third metal film 117 can be reduced, which is advantageous to high degree of integration of the device.

Method for Fabricating Semiconductor Memory Device

Next, a method for fabricating a semiconductor memory device according to one embodiment of the present invention will be described with reference to sectional views shown in FIGS. 2A to 2C, 3A and 3B, 4A and 4B, and 5A and 5B, which illustrate the method in the order of its fabrication process steps.

Figure 2A:
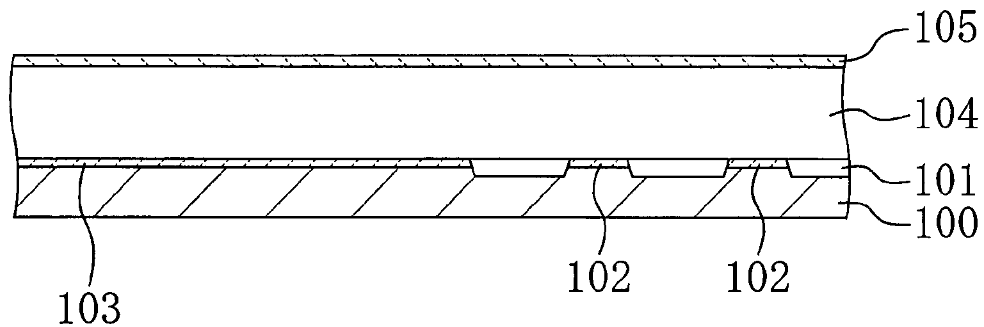
FIGS. 2A to 2C are sectional views showing a method for fabricating a semiconductor memory device according to one embodiment of the present invention in the order of its fabrication process steps.

Referring to FIG. 2A, first, the isolation region (Shallow Trench Isolation) 101 defining element formation regions is formed in the semiconductor substrate 100, and then the first doped layer 102 (the first conductive layer) and the second doped layer 103 (the second conductive layer) are formed in the associated element formation regions. Note that metal silicide may be formed on the surfaces of the first and second doped layers 102 and 103. In this case, lowered resistance can prevent delay of circuit operations to provide a semiconductor memory device capable of operating more rapidly. In FIG. 2A, description is made of the case where the second conductive layer is the second doped layer 103 formed in the semiconductor substrate 100. Instead of the second doped layer 103, as the second conductive layer, use may be made of, for example, an interconnect or the like of polysilicon or tungsten which is formed on the semiconductor substrate 100 and which will be contained in the first insulating film 104 to be described later. Subsequently, on the semiconductor substrate 100, the first insulating film 104 is formed to cover the isolation region 101, the first doped layer 102, and the second doped layer 103, and then, for example, the first hydrogen barrier film 105 of a silicon nitride film having a thickness of about 20 to 100 nm is formed on the first insulating film 104. Although FIG. 2A shows the case where the first hydrogen barrier film 105 is formed, the step of forming the first hydrogen barrier film 105 may not be conducted in consideration of the necessity.

Figure 2B:
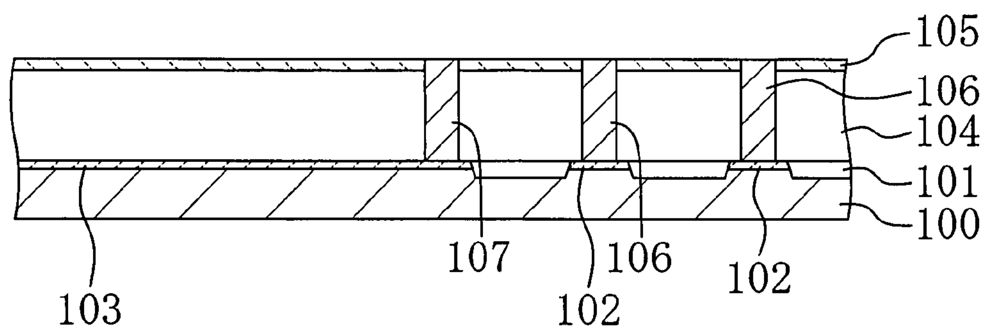

Next, as shown in FIG. 2B, in the first insulating film 104 and the first hydrogen barrier film 105, the first contact plug 106 electrically connected at its bottom end to the first doped layer 102 and the second contact plug 107 electrically connected at its bottom end to the second doped layer 103 are formed to penetrate the first hydrogen barrier film 105 and the first insulating film 104. Note that the first and second contact plugs 106 and 107 are each made of, for example, tungsten or polysilicon. The first and second contact plugs 106 and 107 may be formed to have a barrier film made of, for example, TiN and Ta.

Figure 2C:
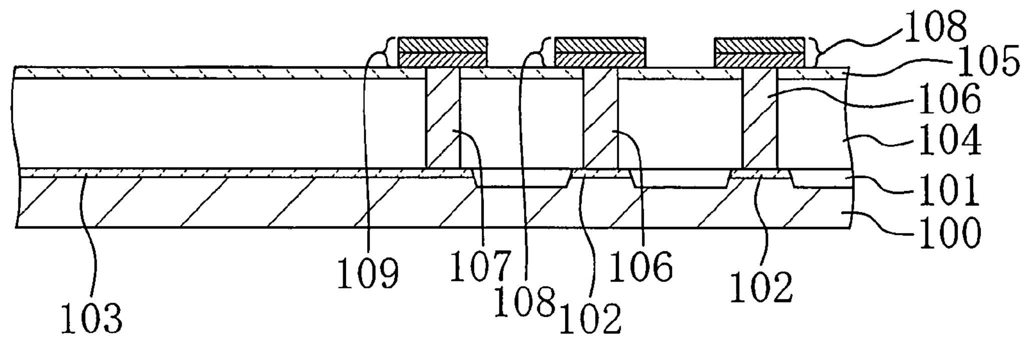

Then, as shown in FIG. 2C, on the first hydrogen barrier film 105, the first laminated barrier film 108 is formed to cover the first contact plug 106. The first laminated barrier film 108 is composed of: a conductive hydrogen barrier film of TiAlN or the like as a lower layer; and a conductive oxygen barrier film of $IrO_x$ or the like as an upper layer. Also, the second laminated barrier film 109 having a similar structure to the first laminated barrier film 108 is formed on the top surface of the second contact plug 107. As shown above, by providing the first and second laminated barrier films 108 and 109, the effect of the oxygen barrier films present on the upper-layer sides of the first and second laminated barrier films 108 and 109 can prevent the first and second contact plugs 106 and 107 from being oxidized by a thermal treatment in an oxygen atmosphere for crystallization of a ferroelectric film 115 that will be described later. Moreover, combined with the effect of the first hydrogen barrier film 105, the effect of the hydrogen barrier films present on the lower-layer sides of the first and second laminated barrier films 108 and 109 can interrupt hydrogen diffusion from below the capacitor element to prevent deterioration in the properties of the capacitor element. Note that in the first and second laminated barrier films 108 and 109, the conductive oxygen barrier film located on the upper-layer side thereof may be formed to have a further laminated structure such as an $IrO_x$/Ir structure. If the crystallization temperature of the ferroelectric film 115 is adequately low, the conductive oxygen barrier film located on the upper-layer side thereof may not be formed. In consideration of the necessity, the conductive hydrogen barrier film located on the lower-layer side thereof may not be formed.

Figure 3A:
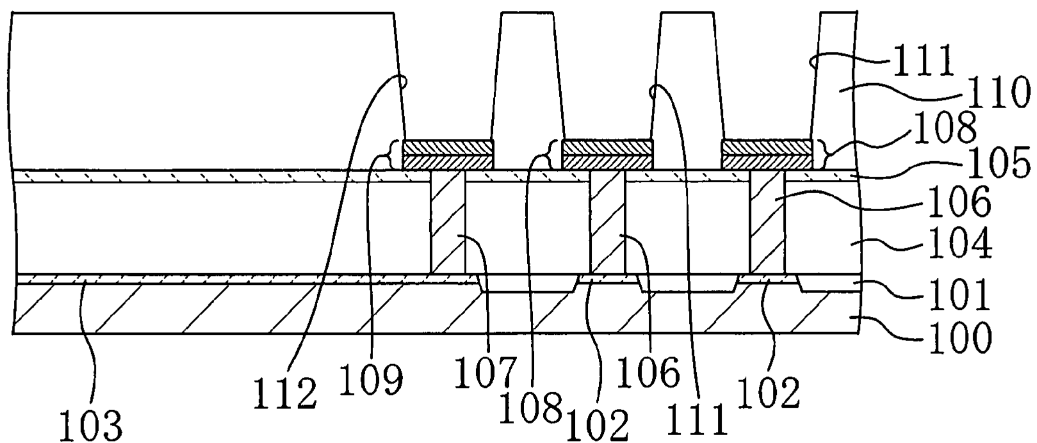
FIGS. 3A and 3B are sectional views showing the method for fabricating a semiconductor memory device according to one embodiment of the present invention in the order of its fabrication process steps.

As shown in FIG. 3A, over the entire surface of the first hydrogen barrier film 105, for example, the second insulating film 110 of a silicon oxide film having a thickness of about 700 to 1000 nm is formed to cover the first laminated barrier film 108 and the second laminated barrier film 109. Then, portions of the second insulating film 110 located above the first and second contact plugs 106 and 107, respectively, are removed by etching to form the first opening 111 exposing the top surface of the first laminated barrier film 108 and the second opening 112 exposing the top surface of the second laminated barrier film 109.

Figure 3B:
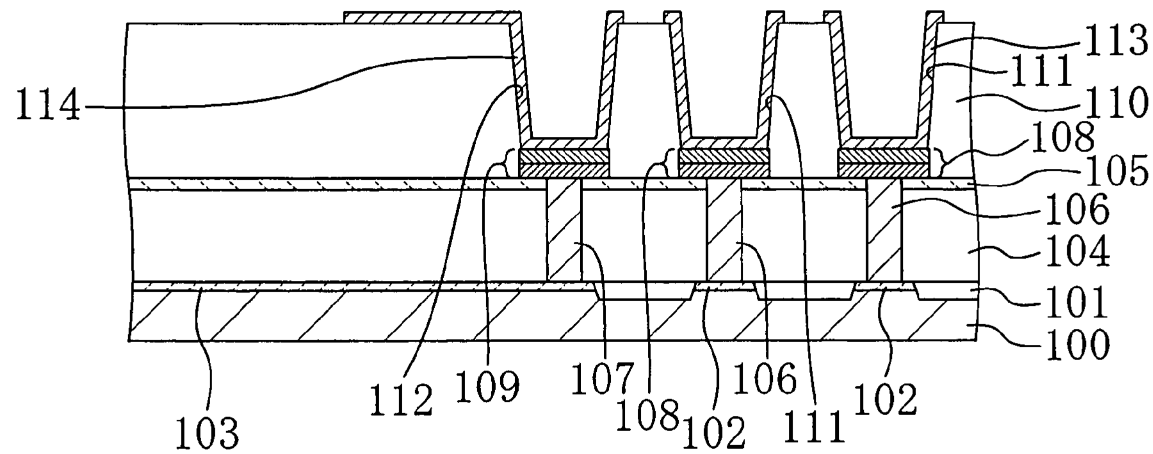

Subsequently, as shown in FIG. 3B, for example, the first metal film 113 of platinum, iridium, or ruthenium is formed to cover the bottom and side wall of the first opening 111, and, for example, the second metal film 114 of platinum, iridium, or ruthenium is formed so that it covers the bottom and side wall of the second opening 112 and its one end located away from the first opening 111 extends onto the top surface of the second insulating film 110. Although in FIG. 3B, the both ends of the first metal film 113 and one end of the second metal film 114 located closer to the first opening 111 extend slightly onto the top surface of the second insulating film 110, these ends may be formed not to have such extensions when possible.

Figure 4A:
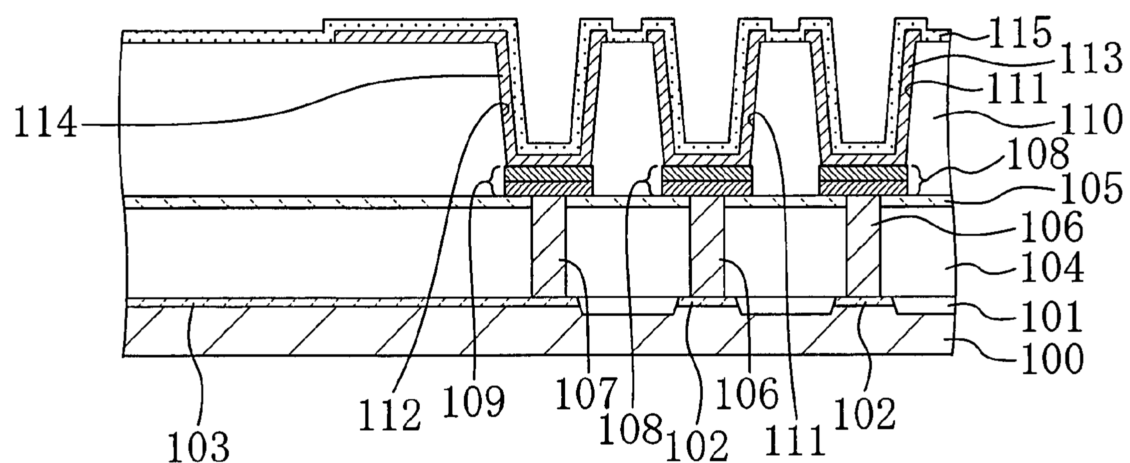
FIGS. 4A and 4B are sectional views showing the method for fabricating a semiconductor memory device according to one embodiment of the present invention in the order of its fabrication process steps.

Next, as shown in FIG. 4A, for example, the SBT-, PZT-, BLT-based ferroelectric film 115 having a thickness of about 50 to 100 nm is deposited over the entire surface of the second insulating film 110 including the top of the first metal film 113 and the top of the second metal film 114.

Figure 4B:
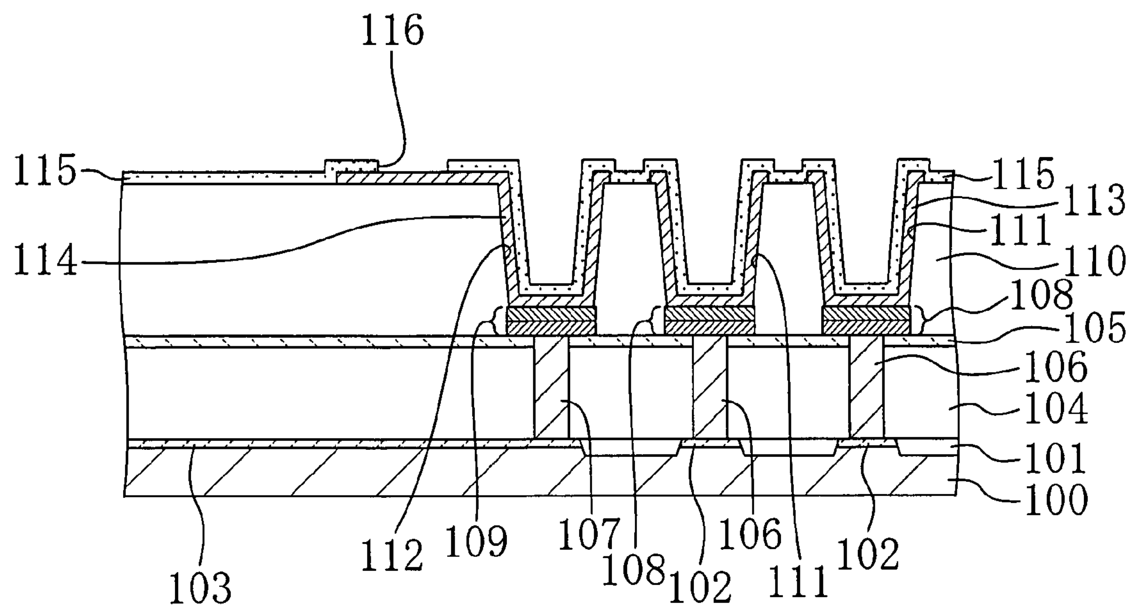

As shown in FIG. 4B, in an area where the second metal film 114 extends onto the top surface of the second insulating film 110, the third opening 116 is formed through the ferroelectric film 115.

Figure 5A:
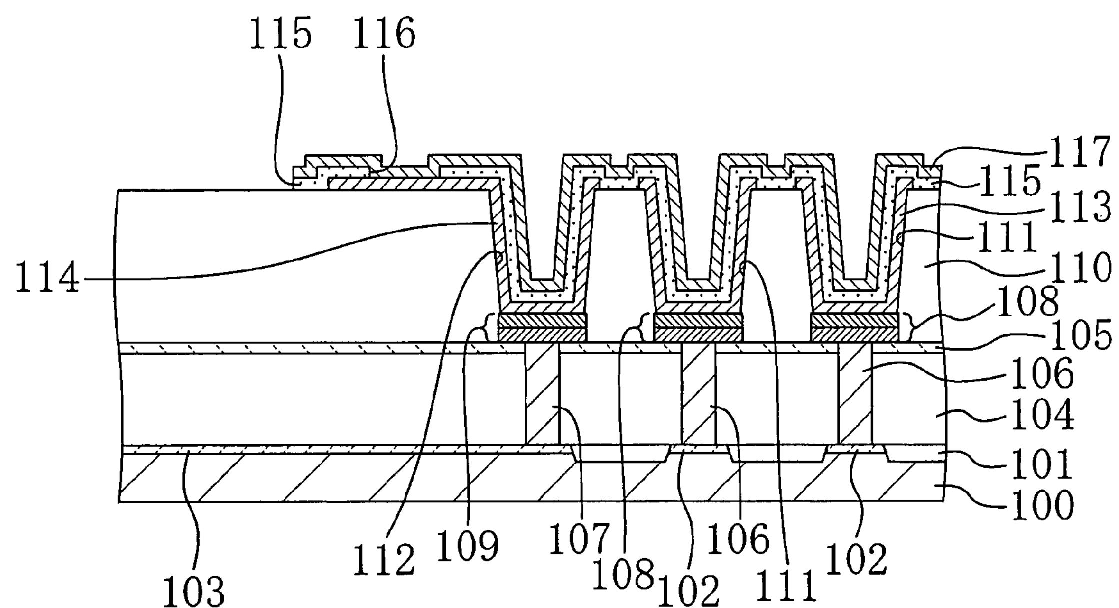
FIGS. 5A and 5B are sectional views showing the method for fabricating a semiconductor memory device according to one embodiment of the present invention in the order of its fabrication process steps.

Subsequently, as shown in FIG. 5A, over the entire surface of the ferroelectric film 115 including the inside of the third opening 106, for example, a third metal 117 made of platinum, iridium, or ruthenium is deposited, and then by a photography method and an etching method, the third metal 117 is patterned to extend across areas between the first and second openings 111 and 112 and between the first openings 111. Although FIG. 5A shows the case where the ferroelectric film 115 is patterned simultaneously with the patterning of the third metal film 117, only the third metal film 117 may be patterned.

Figure 5B:
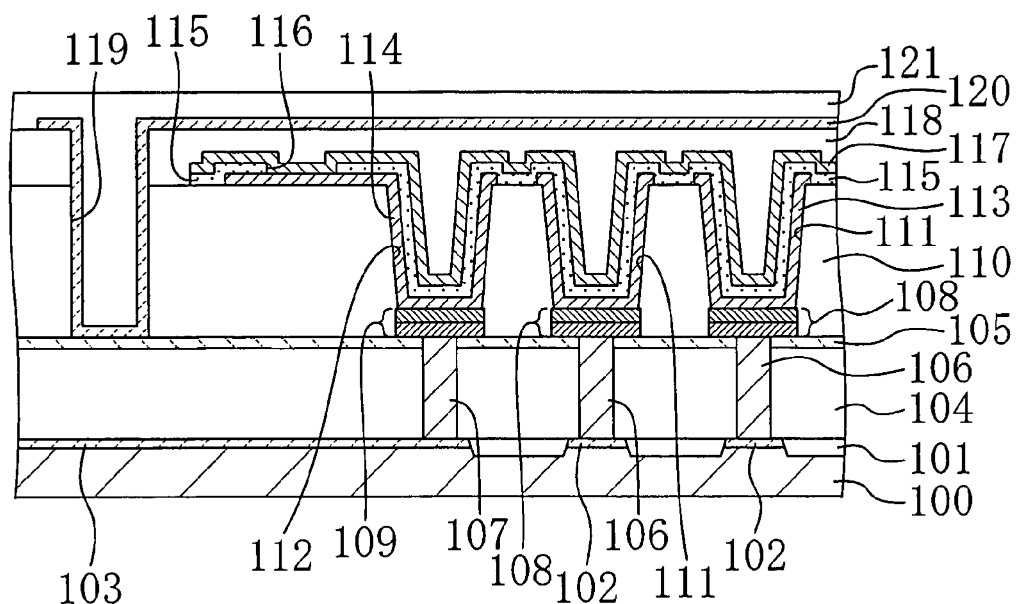

Next, as shown in FIG. 5B, for example, the third insulating film 118 with a thickness of about 50 to 300 nm is formed over the entire surfaces of the second insulating film 110 and the third metal film 117 including the insides of the first and second openings 111 and 112. Then, in the formed third insulating film 118 and the second insulating film 110, the fourth opening 119 is formed which penetrates the third insulating film 118 and the second insulating film 110 to expose the first hydrogen barrier film 105. On the side wall and bottom of the fourth opening 119 and on the third insulating film 118, for example, the second hydrogen barrier film 120 is formed which is made of a silicon nitride film and has a thickness of about 20 to 100 nm. As shown above, by providing the second hydrogen barrier film 120, hydrogen diffusion from above the capacitor element can be interrupted to prevent deterioration in the properties of the capacitor element. Furthermore, the second hydrogen barrier film 120 is connected to the first hydrogen barrier film 105 at the end portion of the cell plate, whereby hydrogen diffusion from the side of the capacitor element can also be interrupted to completely prevent deterioration in the properties of the capacitor element. Subsequently, for example, the fourth insulating film 121 having a thickness of about 100 to 300 nm is formed on the second hydrogen barrier film 120. Although not shown, an interconnect or the like is typically formed on the fourth insulating film 121.

As described above, with the method for fabricating a semiconductor memory device according to this embodiment of the present invention, the stacked structure is formed which is composed of the first metal film 113, the ferroelectric film 115, and the third metal film 117 and covers the bottom and side wall of the first opening 111, and this structure functions as a 3D capacitor element composed of a lower electrode (the first metal film 113), the ferroelectric film 115 (a capacitor insulating film), and an upper electrode (the third metal film 117).

Furthermore, the third metal film 117 is formed on the ferroelectric film 115 provided on the second metal film 114 and also inside the third opening 116 so that it extends across the area between the first and second openings 111 and 112, whereby the upper electrode formed of the third metal film 117 extends through the third opening 116 to make electrical connection to the second metal film 114. The second metal film 114 in turn extends from the top surface of the second insulating film 110 through the side wall of the second opening 112 and the second contact plug 107 to finally make electrical connection to the second laminated barrier film 109 connected to the second doped layer 103.

Therefore, the second metal film 114 functions as part of a contact path for taking the potential of the upper electrode formed of the third metal film 117 to the outside, and thereby the structure capable of taking the potential of the upper electrode formed of the third metal film 117 to the second doped layer 103 formed in the semiconductor substrate 100 can be realized. Moreover, although not shown, the second doped layer 103 is connected to a contact plug connected to an external line on the outer side of the fourth opening 119, that is, on the side thereof away from the memory cell region.

In the construction shown above, out of the contact path for taking the potential of the upper electrode formed of the third metal film 117, a contact portion made by the single-layer upper electrode is formed in the third opening 116. Since the third opening 116 is formed not within the second insulating film 110 with a poor adhesion to the third metal film 117 but within the ferroelectric film 115, the adhesion of the third metal film 117 in the third opening 116 is extremely good. Moreover, since the third opening 116 is provided in an area where the second metal film 114 extends onto the top surface of the second insulating film 110, the depth of the third opening 116 is as small as about 100 nm or less which is a thickness of the ferroelectric film 115. Therefore, the difference in level is hardly caused in this area. This prevents, in the third opening 116, exfoliation of or a break in the upper electrode formed of the third metal film 117, so that the contact by the single-layer upper electrode can be formed with extremely high stability.

On the other hand, the second metal film 114 extends from the top surface of the second insulating film 110 to the side wall and bottom of the second opening 112 to make electrical connection to the second laminated barrier film 109. In this path, a stacked structure composed of the ferroelectric film 115 and the third metal film 117 is formed on the second metal film 114. Thus, the effect of pressing the underlying layer by this stacked structure also prevents exfoliation of or a break in the second metal film 114.

As is apparent from the above, with the method for fabricating a semiconductor memory device according to one embodiment of the present invention, the contact structure for taking the potential of the upper electrode formed of the third metal film 117 can be formed with extremely good yield. Moreover, since the potential of the upper electrode is taken to the second doped layer 103 in the semiconductor substrate 100, the structure in which the hydrogen barrier film fully covers the capacitor element can be realized as in the case of the conventional technique. This completely avoids hydrogen-induced deterioration in the properties of the capacitor element.

In the method for fabricating a semiconductor memory device according to one embodiment of the present invention, in forming the first opening 111, the second opening 112 is simultaneously formed to adjoin the first opening 111. Also, in forming the first metal film 113, the second metal film 114 is simultaneously formed in the second opening 112. This prevents an irregular pattern periodicity produced in these formation steps from occurring in the capacitor element located in the outmost portion of the cell plate. That is to say, even in the capacitor element located in the outmost portion of the cell plate, the first opening 111, the first metal film 113, or the like can be processed in the state in which the same patterns are present at its both sides like the capacitor elements located in portions other than the outmost portion of the cell plate. This prevents the capacitor element located in the outmost portion of the cell plate from being processed into a specific shape, so that deterioration in the properties of the capacitor element located in the outmost portion of the cell plate can be avoided.

Furthermore, in the method for fabricating a semiconductor memory device according to one embodiment of the present invention, the second opening 112 is formed simultaneously with the formation of the first opening 111 by etching only a single layer, that is, only the second insulating film 110. This eliminates etching of the stacked film of the ferroelectric film 115 and the second insulating film 110, which is necessary for formation of the second opening 22 in the conventional method for fabricating a semiconductor memory device described in FIG. 7. Thereby, the second opening 112 can be formed easily.

Moreover, in the method for fabricating a semiconductor memory device according to one embodiment of the present invention, the number of times masks are used during the period from formation of the second insulating film 110 to formation of the upper electrode made of the third metal film 117 is three: formation of the first and second openings 111 and 112 (first), formation of the first and second metal films 113 and 114 (second), and formation of the third opening 116 (third). Thus, the number of times masks are used does not increase as compared with the number of times masks are used in the conventional method for fabricating a semiconductor memory device (which is three: formation of the first opening 21 (first), formation of the lower electrode 23 (second), and formation of the second opening 22 (third)). Therefore, a ferroelectric memory device with excellent properties can be formed, with high yield, without increasing the number of process steps.

Modification of One Embodiment

Figure 6:
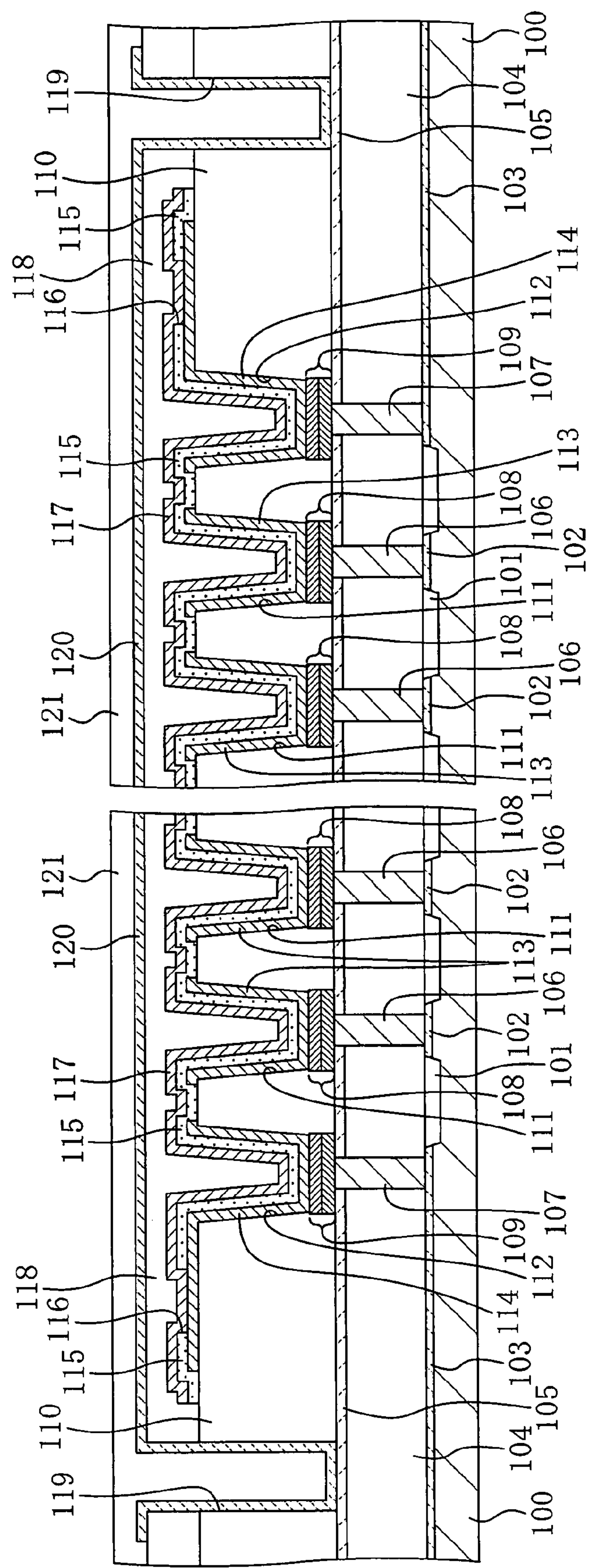
FIG. 6 is a sectional view showing the structure of a semiconductor memory device according to a modification of one embodiment of the present invention.

Preferably, in a semiconductor memory device according to a modification of one embodiment of the present invention, a construction shown in FIG. 6 is employed for the structure for taking the potential of the upper electrode formed of the third metal film 117 to the second doped layer 103 formed in the semiconductor substrate 100, which is constructed by the second contact plug 107, the second laminated barrier film 109, the second opening 112, the second metal film 114, and the third opening 116.

To be more specific, preferably, the capacitor element formed in the first opening 111 and composed of: the first metal film 113 as a lower electrode; the ferroelectric film 115 as a capacitor insulating film; and the third metal film 117 as an upper electrode is provided not only next to one outmost portion shown in FIG. 1 but also next to the other outmost portion of the region where the multiple capacitor elements are arranged with its upper electrode shared as a common cell plate.

With such a structure, the resistance component of the upper electrodes connected to one structure for taking the potential of the upper electrode can be reduced. Therefore, in driving the potential of the common cell plate formed of the upper electrodes, a delay in the driving speed generated by the resistance component of the upper electrodes can be effectively prevented to provide a ferroelectric memory device capable of operating more rapidly.

In the case of this structure, preferably, as shown in FIG. 6, the structure in which the second hydrogen barrier film 119 extends through the fourth opening 119 to make connection to the first hydrogen barrier film 105 is formed in the both outmost portions of the common cell plate.

With such a structure, all of the multiple capacitor elements arranged in the common cell plate can be fully covered with the first and second hydrogen barrier films 105 and 120. Therefore, deterioration in the properties of the capacitor element due to hydrogen diffusion during fabrication processes can be completely prevented to provide a ferroelectric memory device with excellent properties.

As described above, the semiconductor memory device and its fabrication method according to the present invention are useful for a semiconductor memory device including a capacitor element with a capacitor insulating film made of a ferroelectric film and for a fabrication method of such a device.

What is claimed is:

1. A semiconductor memory device comprising:

a first conductive layer and a second conductive layer formed apart from each other in a semiconductor substrate;

a first insulating film formed on the semiconductor substrate, the first conductive layer, and the second conductive layer;

a first plug penetrating the first insulating film and connected at its bottom end to the first conductive layer;

a second plug penetrating the first insulating film and connected at its bottom end to the second conductive layer;

a second insulating film formed over the first insulating film and having at least a first opening and a second opening, the first opening being located above the first plug, the second opening being located above the second plug;

a first metal film formed on at least the bottom and side wall of the first opening and electrically connected to the first plug;

a second metal film formed on at least the bottom and side wall of the second opening and electrically connected to the second plug;

a first capacitor insulating film made of a ferroelectric film formed on at least the first metal film;

a second capacitor insulating film made of a ferroelectric film formed on at least the second metal film; and a third metal film formed to extend onto the tops of the first and second capacitor insulating films and across an area between the first and second openings, wherein:

the second metal film has an extending portion on the top surface of the second insulating film, the extending portion extending from the second opening in a direction away from the first opening, the second metal film is connected at its extending portion to the third metal film, a plurality of first structures each including the first conductive layer, the first plug, the first opening, the first metal film, and the first capacitor insulating film are formed to be arranged at regular intervals in an area located opposite to a second structure including the second conductive layer, the second plug, the second opening, the second metal film, and the second capacitor insulating film, the distance between the second opening and a first opening of the plurality of first opening which is located in one end of a region formed with the plurality of first openings is identical to the distances between the plurality of first openings, the one end adjoining the second opening, and the first openings and the second opening have the same diameter.

2. The device of claim 1, wherein the second capacitor insulating film has an extending portion on the top surface of the second insulating film, the extending portion extending from the second opening in a direction away from the first opening and having a third opening exposing the extending portion of the second metal film, and the second metal film and the third metal film are connected to each other in the third opening.

3. The device of claim 1, further comprising an oxygen barrier film between the first plug and the first metal film and between the second plug and the second metal film.

4. The device of claim 1, wherein the first metal film, the first capacitor insulating film, and a portion of the third metal film covering the inside of the first opening are covered with a hydrogen barrier film.

5. The device of claim 1, wherein the second structure is also formed next to a first structure of the plurality of first structures located in the other end of the region formed with the first structures.

6. The device of claim 1, wherein the first capacitor insulating film and the second capacitor insulating film are connected to each other between the first opening and the second opening.

* * * * *